United States Patent [19]

Engel et al.

[11] 4,338,589
[45] Jul. 6, 1982

[54] AUTOCALIBRATION OF COMPRESSED A/D CONVERTER

[75] Inventors: Steven J. Engel, West Whiteland; Richard E. Marsh, Kemblesville, both of Pa.; Robert P. Rhodes, Newark, Del.

[73] Assignee: Hewlett-Packard Company, Palo Alto, Calif.

[21] Appl. No.: 11,822

[22] Filed: Feb. 13, 1979

[51] Int. Cl.³ ............................................. H03K 13/02
[52] U.S. Cl. ...................... 340/347 CC; 340/347 AD; 340/347 M; 364/722; 367/66
[58] Field of Search .... 340/347 M, 347 AD, 347 CC; 364/722; 367/65–67

[56] References Cited
PUBLICATIONS

The Engineering Staff of Analog Devices, Inc., *Analog–Digital Conversion Handbook,* 1972, pp. II-158, 159.

Wells, *College Algebra,* D. C. Heath & Co., 1899, pp. 352–359.

*Primary Examiner*—Thomas J. Sloyan
*Attorney, Agent, or Firm*—Donald N. Timbie

[57] ABSTRACT

An analog-to-digital converter system is disclosed in which the amplitude of the signal is compressed by means including a logging means prior to an analog-to-digital converter. Reference signals of known values are applied to the logging means and their values at the output of the converter are used to determine a linearity factor which is applied to a multiplier coupled to the output of the converter. The amplitude of one of the reference signals at the output of the multiplier is compared with what it should be and the difference is added by an adder at the output of the multiplier.

7 Claims, 9 Drawing Figures

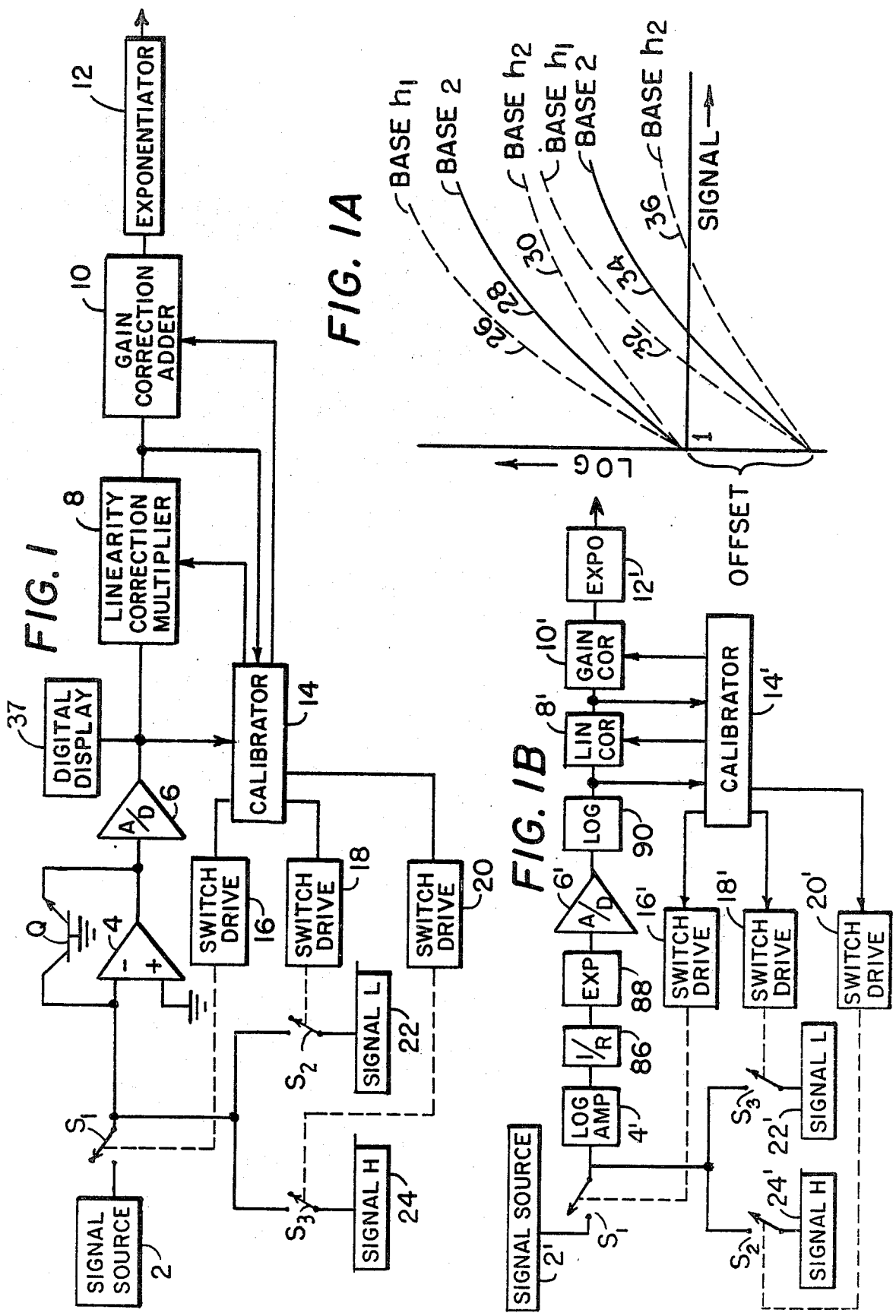

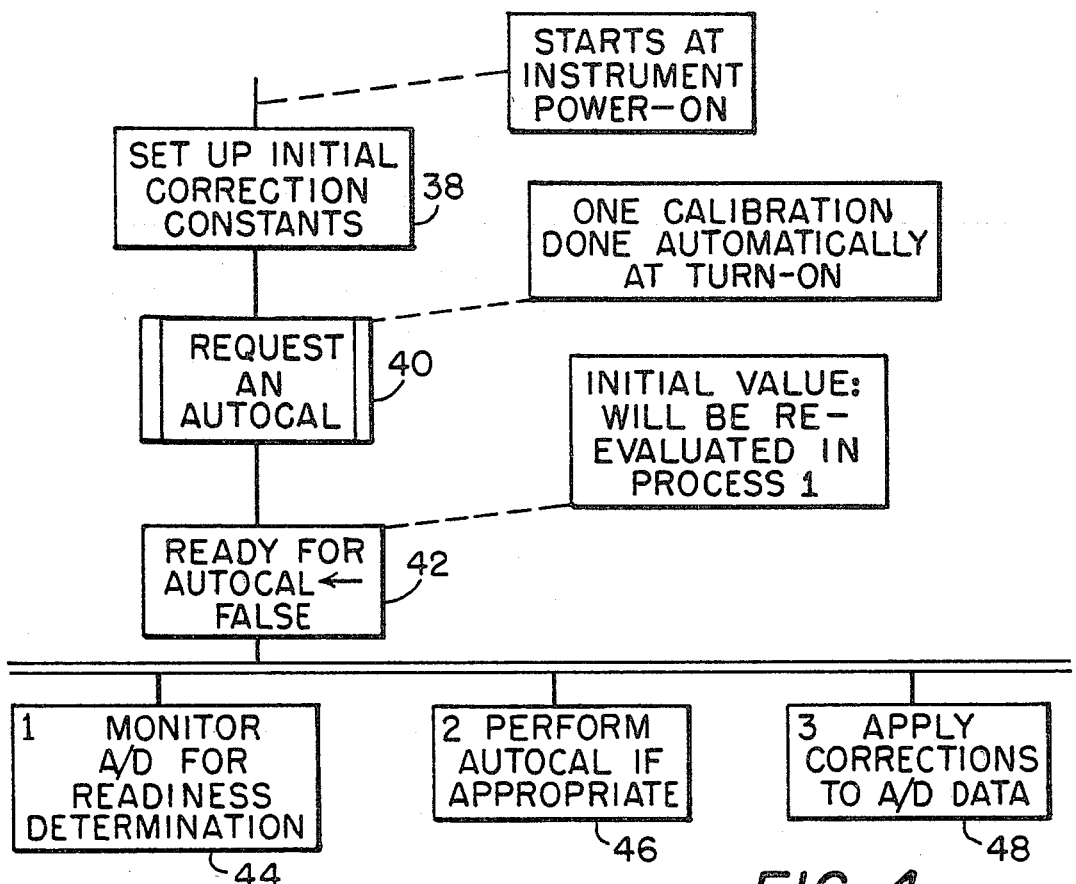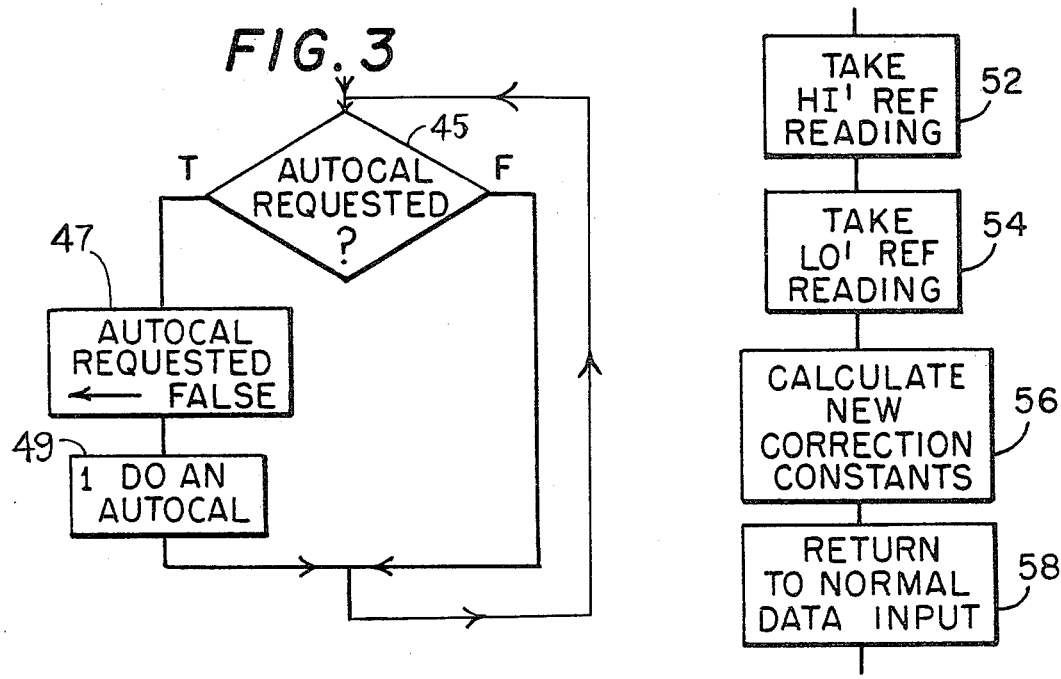

AUTOCALIBRATION OF COMPRESSED A/D CONVERTER

BACKGROUND OF THE INVENTION

Inasmuch as digital processing is preferred to analog processing, analog signals are converted into digital form by an A/D converter before being used by a digital system. If the analog signal has a small dynamic range, the number of bits required can be economical, but if the dynamic range is large, such as the dynamic range of $2^{31}$ of signals of detectors used with chromatographs, thirty-one bits would be required and the fractional resolution would vary from a value of unity at the low end of the range to a value of one in $2^{31}-1$ at the high end. In order to reduce the expense and to achieve practical designs, autoranging is used because the dynamic range is larger than practical devices can handle. An autoranging system employs a lesser number of bits to cover successive portions of the dynamic range, but this introduces problems in calibration as well as problems in determining which portion of the range is involved. Another undesirable characteristic is the change in resolution from maximum to minimum value within each portion of the range.

BRIEF DISCUSSION OF THE INVENTION

The problems enumerated above are solved in a system using this invention. Signals of large dynamic range are converted to logarithmic form by a hardware circuit which may operate on one of a range of bases and which may have a certain amount of offset. At this point, the A/D conversion is made. Prior to exponentiation, the output of the circuit is corrected to a predetermined base and the offset is eliminated.

Sample signals having a known ratio are applied to the input of the logarithmic circuit, and their amplitudes are measured at the output of the A/D converter. From this, the actual base of the logarithm derived by the logarithmic circuit is determined. A linearity correction signal is then derived that is used to multiply the output of the A/D converter so that it is changed to a logarithm of a desired base. After such correction, the difference between the logarithm of one of the signals and the value it should have is derived so as to determine the amount by which the output of the logarithmic circuit is greater or less than it should be. A suitable amount is then added to the corrected output of the A/D converter so as to produce a logarithmic signal having the desired base and having a zero value for an input signal of value "1".

DESCRIPTION OF THE DRAWINGS

FIG. 1 is a schematic diagram of a calibration system embodying the invention;

FIG. 1A includes graphs used in explaining the operation of FIG. 1;

FIG. 1B is a schematic diagram of the invention when root compression is used;

FIG. 2 is a flow chart of the overall functions to be performed;

FIG. 3 is a flow chart of the functions performed in making a decision as to whether to perform an autocalibration;

FIG. 4 is a flow chart of the steps involved in making an autocalibration;

Figure 5:
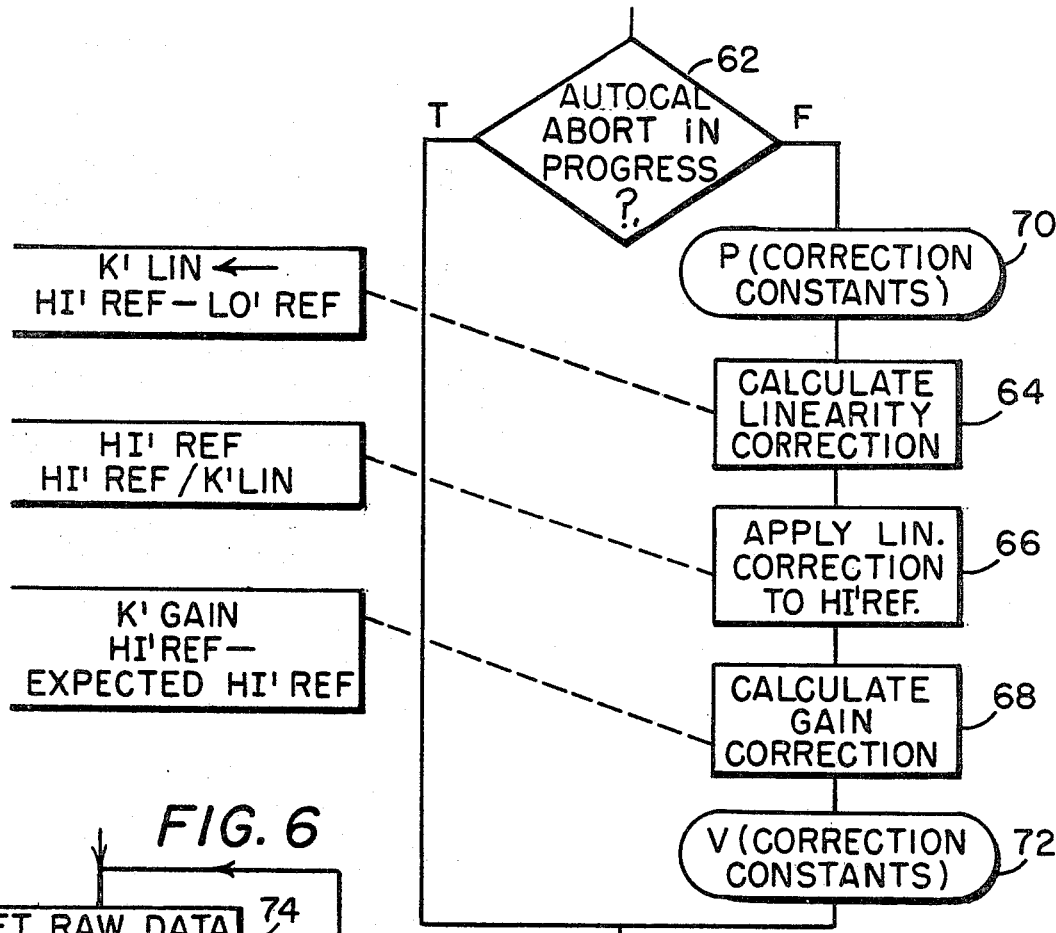
FIG. 5 is a flow chart of the functions performed by the calibrator in calculating the correction signals.

In the autocalibration system of FIG. 1, signals which may, for example, be current variations, frequency variations, or voltage variations provided by different kinds of detectors used with chromatographs are provided by a source 2. A switch $S_1$ is connected between the source 2 and a logarithmic circuit, herein illustrated as being comprised of an operational amplifier 4 having its inverting input connected to the switch $S_1$, its non-inverting input connected to ground, and its output connected to a linear A/D converter 6. Logarithmic operation is provided by connecting the emitter of a transistor Q to the output of the amplifier 4, its base to ground, and its collector to the inverting input of the amplifier 4. A linearity correction multiplier 8, a gain correction adder 10, and an exponentiator 12 are connected in series to the output of the A/D converter 6.

When the calibration procedure is to be performed, the calibrator 14 sends a signal to a switch drive 16 that opens the switch $S_1$. The calibrator 14 then sends a signal to a switch drive 18 that closes a switch $S_2$ so as to connect a source 22 of a signal L to the inverting input of the amplifier 4. At another moment, it sends a signal to the switch drive 18 to open the switch $S_2$, and sends a signal to a switch drive 20 that closes a switch $S_3$ so as to connect a source 24 of a signal H to the inverting input of the logarithmic amplifier 4.

The output of the A/D converter 6 is connected to the calibrator 14 so that the digitized form of the signals H and L may be applied thereto. In a manner to be explained, the calibrator 14 calculates a linearity correction signal to be applied to the linearity correction multiplier 8. The output of the multiplier 8 is connected to the calibrator 14 so that it can calculate the amount of gain correction signal that must be added by the adder 10 to compensate for the offset of the logarithmic signals at the output of the amplifier 4.

Operation

Reference is now made to the graphs 26, 28 and 30 of FIG. 1A which represent the logarithmic output of the amplifier 4 when it is operating at bases $h_1$, 2, and $h_2$ respectively and when its output has a zero offset. Graphs 32, 34 and 36 represent the logarithmic output of the amplifier 4 when it is operating at the same bases $h_1$, 2, and $h_2$ respectively, but with an offset. Thus, if the graphs 32, 34 and 36 were moved upwardly by the amount of the offset, they would respectively coincide with the graphs 26, 28 and 30. Multiplication of the values of any of the graphs 26, 28 and 30 by an appropriate constant can cause them to coincide with any of the others. Thus, if the values of the graph 26 are multiplied by a given fraction, we obtain the solid line graph 28; and if the values of the graph 30 are multiplied by a certain value $>1$, we also obtain the solid line graph 28. The same applies to the lower set of graphs 32, 34 and 36.

Assume that the logarithmic amplifier 4 is operating with a base $h_1$ and has an offset so as to provide an output as indicated by the curve 32 and that we wish to convert the output to a log having the base 2 and without any offset, as shown by the curve 28.

First, let us determine the constant, which when multiplied by $\log_h$ of any signal value A results in $\log_2 A$. To do this, open the switch $S_1$, close the switch $S_2$, and measure the output of the log amplifier 4, which will be $\log_h L$ plus some offset. Then open switch $S_2$ and close switch $S_3$ and measure the output of the log amplifier 4, which will be $\log_h H$ plus the offset. Therefore, $$\log_h H/L = \log_h H - \log_h L. \quad (1)$$

H/L is known and the offsets cancel. From the log theorem for converting from one base to another, it can be said that $$\log_{H/L} A = \frac{\log_h A}{\log_h H/L} \quad (2)$$

Thus, by dividing the log for any signal value A that is obtained from the graph 32, and therefore from the log amplifier 4, by the $\log_h H/L$, the latter having been determined from equation (1), we have converted to the base H/L. By making H/L equal to the desired base, e.g., 2, the desired conversion to the base 2 is obtained directly from equation (2).

If, however, H/L is something other than the base to which we wish to convert, i.e., it is something other than 2 in the assumed example, convert from the base H/L to the base 2 by applying the same log theorem so as to convert from the base H/L of equation (2) to the base 2.

$$\log_2 A = \frac{\log_{H/L} A}{\log_{H/L} 2} \quad (3)$$

Then substituting from equation (2) for the numerator, we obtain:

$$\log_2 A = \frac{\log_h A}{\log_h H/L \times \log_{H/L} 2} \quad (4)$$

The denominator of equation (4) is the linearity correction. If, as first assumed, H/L=2, then $\log_{H/L} 2 = 1$. Therefore, by dividing the log values of curve 32 by $\log_h H/L$, which was calculated from measurements in equation (1), one obtains the solid line graph 34.

Now that the linearity correction for translating the graph 32 to the graph 34 has been obtained, it remains to derive a gain correction so as to translate from the graph 34, which has an offset, to the graph 28, which has none. Inasmuch as we know the value of a reference signal such as H, we known what $\log_2 H$ should be, and we know what the measured value of $\log_2 H$ is from the corrected graph 34. The difference is the offset or gain correction, or gain correction = $\log_2 H$ (from graph 34) — $\log_2 H$ \quad (5)

as desired (graph 28). The complete processing for each value at the output of the A/D converter 6 is $$\text{output} = 2 \left( \frac{A/D \text{ value}}{\text{linearity correction}} - \text{gain correction} \right) \quad (6)$$

Calibrator

Although it is feasible to manually perform the calibration of this invention by applying reference signals H and L and noting the digital output of the A/D converter on a digital display 37, computing the linearity and gain corrections and manually setting the multiplier 8 and the adder 10, it would be easier to perform these steps by using a program running on a computer. The flow charts of FIGS. 2, 3, 4, 5, 6 and 7 indicate the functions to be performed in a manner such that anyone skilled in the art could set up such a program.

In block 38 of FIG. 2, initial correction constants for linearity and gain, which may be estimated from experience, are applied to the multiplier 8 and the adder 10 respectively. Block 40 indicates that a calibration is desired. This can occur whenever the equipment is turned on or whenever the operator demands it by moving an appropriate control. Block 42 indicates that a check on factors, such as power being available, must be done before indicating that the equipment is ready for calibration.

If the equipment is otherwise ready, these general programs are carried out. Block 44 indicates a check to see if the A/D converter 6 is ready, i.e., if power is being supplied to it and it is at temperature equilibrium. Block 46 indicates the performance of the calibration procedure if everything is ready, as set forth in greater detail in FIG. 3, and block 48 indicates the actual application of the linearity and gain corrections to the multiplier 8 and the adder 10, as set forth in greater detail in FIG. 5. If an autocalibration is requested, decision block 45, FIG. 3, there is an indication, block 47, and instructions are given to perform the autocalibration, block 49.

In performing the calibration, the reference signal H is inserted and the reading of the output of the A/D converter 6 is taken as indicated in the block 52, and the reference signal L is inserted and the A/D converter 6 is read as indicated at block 54. The correction constants are calculated as generally indicated in block 56 and as more particularly described in FIG. 5. After this is done, the switch $S_1$ is closed, block 58.

FIG. 5 illustrates the calculation of the linearity and gain constants. First, as indicated by a decision block 62, a decision is made as to whether the calibration has been aborted for any reason, such as an A/D hardware problem or a power failure. If not, the linearity correction constant K'LIN is determined, block 64, by subtracting the log of the low reference, L, from the log of the high reference, H, as they appear at the output of the A/D converter 6. Block 66 indicates that the linearity correction is made to a high reference H at the output of the A/D converter 6 by dividing it by the linearity constant K'LIN derived as indicated at block 64. The gain correction constant K'GAIN is then calculated, block 68, by subtracting the expected $\log_2 H$ reference from the actual $\log_2 H$ after linearity correction. The blocks 70 and 72 that are respectively before the block 64 and after the block 68 are well known symbols indicating that the correction constants cannot be used at other parts of the circuit while they are being calculated.

Figure 6:
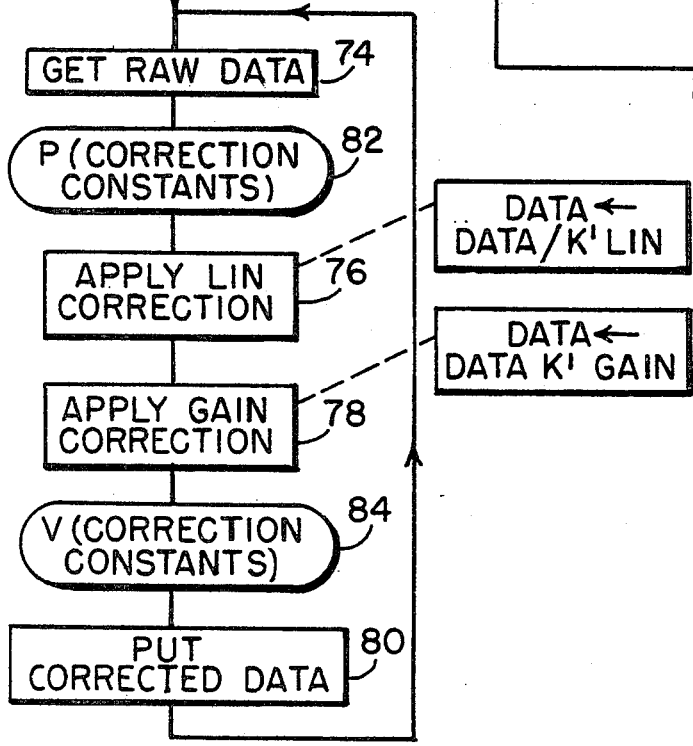
FIG. 6 is a flow chart of the functions performed in applying correction signals.
Figure 7:
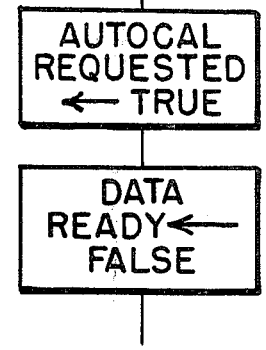
FIG. 7 is a flow chart of the function used in requesting an autocalibration.

FIG. 6 indicates the functions performed when the linearity correction and the gain correction that were calculated as shown in FIG. 5 are applied to the linearity correction multiplier 8 and the gain correction adder 10, respectively, of FIG. 1. Raw data, i.e., signal A, is derived from the A/D converter 6 and applied to the multiplier 8 as previously explained. There, the data is divided by the linearity correction constant which was calculated at block 64 of FIG. 5, as shown in block 76. Then, as indicated by block 78, the gain correction, calculated at block 68 of FIG. 5, is subtracted from the data in the adder 10 after the data has been corrected for linearity. Block 80 indicates that the fully corrected data is then passed on to the rest of the equipment, which, as indicated in FIG. 1, could be the exponentiator 12. The blocks 82 and 84 that are respectively before the block 76 and after the block 78 indicate that the correction constants are not to be changed by new calculations from FIG. 5 while they are being used to correct the data.

Root Compression

For various reasons, it may be desirable to compress the amplitude of the signal in accordance with a different function than the logarithm before it is applied to the analog-to-digital converter. FIG. 1B illustrates apparatus wherein the compression is in accordance with the Rth root. Components corresponding to FIG. 1 are designated by the same numerals primed. In order to derive the root, the output of the log amplifier 4' is divided by R in a divider 86 and then exponentiated in an exponentiator 88 so as to derive the Rth root of the signal. As in FIG. 1, the compressed signal is applied to an analog-to-digital converter 6', but means 90 for deriving the logarithm of the output of the converter 6' to any convenient base is inserted between the converter and the linearity correction multiplier 8'. The calibrator 14' is connected to the output of the log means 90.

If the base of the exponentiator 88 is the same as the base of the logging device 90, one cancels the effects of the other, but it is not necessary that the bases be the same as any difference is the same as a linearity error which can be eliminated by the calibration technique discussed in connection with FIG. 1. With this in mind, the log of a signal at the output of the logging device 90 of FIG. 1B may be used for purposes of calibration in the same manner as the output of the A/D converter 6 of FIG. 1. Note also that the factor 1/R, being a multiplier of the log taken by the log amplifier 4', will merely cause a change in the linearity constant.

Thus, it can be seen that the family of characteristics produced by the system of FIG. 1 is comprised of logarithms to different bases and the family of characteristics produced by the system of FIG. 1B is comprised of different roots.

What is claimed is:
1. An analog-to-digital converter system comprising
   logging means for producing at its output the logarithm to an unknown base h of an analog signal applied to its input,
   an analog-to-digital converter having an input and an output,
   means coupling the output of said log deriving means to the input of said analog-to-digital converter,
   a multiplier having an input and an output,
   means coupling the output of said analog-to-digital converter to the input of said multiplier,
   an exponentiator operating at a desired base and having an input and an output, said input being coupled to the output of said multiplier,
   means for applying a reference signal H of known value to the input of said logging means,
   means for applying a reference signal L of known value to the input of said logging means,
   means coupled to the input of said multiplier for deriving a linearity correction factor equal to the logarithm to the base h of H/L, times logarithm to the base H/L of the desired base, and
   means causing said multiplier to multiply signals applied to it by the reciprocal of the correction factor.

2. A system as set forth in claim 1 having an adder having first and second inputs and an output, said first input being coupled to the output of said multiplier and said output being coupled to the input of said exponentiator and including means coupled to the output of said multiplier for deriving a gain correction factor equal to the difference between the amplitudes of one of said reference signals at the output of said multiplier and the log of that reference signal to the desired base, and
   means for applying said gain correction factor to the second input of said adder.

3. A system as set forth in claim 1 wherein said means coupling the output of said log deriving means to the input of said analog-to-digital converter includes means for dividing the signal by an approximate factor R and an exponentiator connected in the order named and wherein said means coupling the output of said analog-to-digital converter to the input of said multiplier includes a logging means.

4. An analog-to-digital converter system comprising
   input terminals to which an analog signal may be applied,
   a first logging means operating at an unknown base h,
   a divider coupled to the output of said first logging means so as to derive the base of an unknown root of a signal applied to said input terminals, said first logging means, said divider, a first exponentiator, an analog-to-digital converter, a second logging means, a multiplier, an adder and a second exponentiator that operates to a desired base A, connected in cascade,
   means for applying predetermined signals H and L to the input of said first logging means at different times,
   means coupled to the output of said second logging means for deriving a linearity correction factor equal to the logarithm to the base h of H/L times the log to the base H/L of the desired base A,
   means for causing said multiplier to multiply signals it receives from said second logging means by the reciprocal of the linearity correction factor,
   means coupled to the output of said multiplier for deriving a gain correction factor equal to the difference between the amplitude of one of said reference signals at the output of said multiplier and the amplitude of said one reference signal to the base A,
   means for causing said adder to add an amount equal to the gain correction factor to the signals passing through it, and
   an exponentiator operating at the desired base A coupled to the output of said adder.

5. An analog-to-digital conversion system as set forth in claim 1 wherein said means for deriving a linearity correction factor is comprised of
   subtracting means coupled to the output of said analog-to-digital converter for obtaining the difference between the output of said A/D conversion means when a reference signal H is applied to said input terminal and the output of said logging means when a reference signal L is applied to said input, and
   means for multiplying the output of said subtracting means by the logarithm to the base H/L of a desired base.

6. A compressed analog-to-digital conversion system having an input terminal to which an analog signal may be applied, comprising root compression means for producing at an output thereof the digital form of the logarithm of an unknown root of a signal applied to said input terminal, a multiplier having an input and an output, said input being coupled to the output of said compression means, means for applying a reference signal H to said input terminal at one point in time, means for applying a reference signal L to said input terminal at another point in time, the ratio of the amplitude of the signal H to the amplitude of the signal L being known, means coupled to the output of said root compression means for deriving a linearity correction factor equal to the logarithm to the base h of H/L times the logarithm to a base H/L at a desired base, means for causing said multiplier to multiply the signals it receives from said root compression means by the reciprocal of said correction factor, and an exponentiator operating at the desired base coupled to the output of said multiplier.

7. An analog-to-digital conversion system as set forth in claim 6 wherein said means for deriving a linearity correction factor is comprised of subtracting means coupled to the output of said compression means for obtaining the difference between the output of said latter means when a reference signal H is applied to said input terminal and the output of said means when a reference signal L is applied to said input, and means for multiplying the output of said subtracting means by the logarithm to the base H/L of a desired base.

* * * * *